US008299835B2

(12) United States Patent
Koudymov et al.

(10) Patent No.: US 8,299,835 B2
(45) Date of Patent: Oct. 30, 2012

(54) RADIO-FREQUENCY SWITCH CIRCUIT WITH SEPARATELY CONTROLLED SHUNT SWITCHING DEVICE

(75) Inventors: Alexei Koudymov, Troy, NY (US); Grigory Simin, Columbia, SC (US); Michael Shur, Latham, NY (US); Remis Gaska, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 837 days.

(21) Appl. No.: 12/364,140

(22) Filed: Feb. 2, 2009

(65) Prior Publication Data
US 2009/0195232 A1  Aug. 6, 2009

Related U.S. Application Data

(60) Provisional application No. 61/063,250, filed on Feb. 1, 2008.

(51) Int. Cl.
*H03L 5/00* (2006.01)
(52) U.S. Cl. ............ 327/308; 327/430; 333/103
(58) Field of Classification Search ............ 327/308, 327/430; 333/81 R, 103
See application file for complete search history.

(56) References Cited

U.S. PATENT DOCUMENTS

| | | | | |
|---|---|---|---|---|
| 3,678,297 A * | 7/1972 | Takahashi | ...... | 327/432 |
| 3,731,116 A * | 5/1973 | Hill | ...... | 327/374 |
| 3,872,325 A * | 3/1975 | Adams et al. | ...... | 327/389 |
| 4,316,101 A * | 2/1982 | Minner | ...... | 327/434 |
| 5,767,721 A * | 6/1998 | Crampton | ...... | 327/308 |
| 6,308,047 B1 * | 10/2001 | Yamamoto et al. | ...... | 455/73 |
| 6,396,325 B2 * | 5/2002 | Goodell | ...... | 327/308 |
| 6,496,072 B2 * | 12/2002 | Cho et al. | ...... | 330/284 |
| 7,250,804 B2 * | 7/2007 | Brindle | ...... | 327/365 |
| 7,274,242 B2 * | 9/2007 | Farjad-rad | ...... | 327/382 |

OTHER PUBLICATIONS

Gu et al., "A 2.3V PHEMP Power SP3T Antenna Switch IC for GSM Handsets", IEEE GaAs Digest, pp. 48-51, 2003.
Yang et al., "High-Power Operation of III-N MOSHFET RF Switches", IEEE Microwave and Wireless Components Letters, vol. 15, No. 12, pp. 850-852, Dec. 2005.
Koudymov et al.,"Monolithically Integrated High-Power Broad-Band RF Switch Based on III-N Insulated Gate Transistors", IEEE Microwave and Wireless Components Letters, vol. 14, No. 12, pp. 560-562, Dec. 2004.
McCgrath et al., "Novel High Performance SPDT Power Switches Using Multi-Gate FET's", IEEE MTT-S Digest, pp. 839-842, 1991.
P-N Designs, Inc., "Switch FETs and FET switches", Printed from http://www.microwaves101.com/encyclopedia/switches_FET.cfm, 6 pages Jan. 2, 2009.
Khan et al., "Insulating Gate III-N Heterostructure Field-Effect Transistors for High-Power Microwave and Switching Applications", IEEE Transactions on Microwave Theory and Techniques, pp. 624-633, vol. 51, No. 2, Feb. 2003.
Gopinath et al., "GaAs FET RF Switches", IEEE Transactions on Electron Devices, pp. 1272-1278, vol. ED-32, No. 7, Jul. 1985.

* cited by examiner

*Primary Examiner* — Kenneth B. Wells
(74) *Attorney, Agent, or Firm* — Hoffman Warnick LLC

(57) ABSTRACT

A switch circuit is provided that includes at least one main switching device and at least one shunt switching device. Each main switching device is connected in series with a conductor that carries an RF signal between an input circuit and an output circuit. Each shunt switching device is connected between a controlling terminal of the main switching device and a high frequency ground. The switch circuit can provide substantially improved OFF state isolation over other approaches.

20 Claims, 9 Drawing Sheets

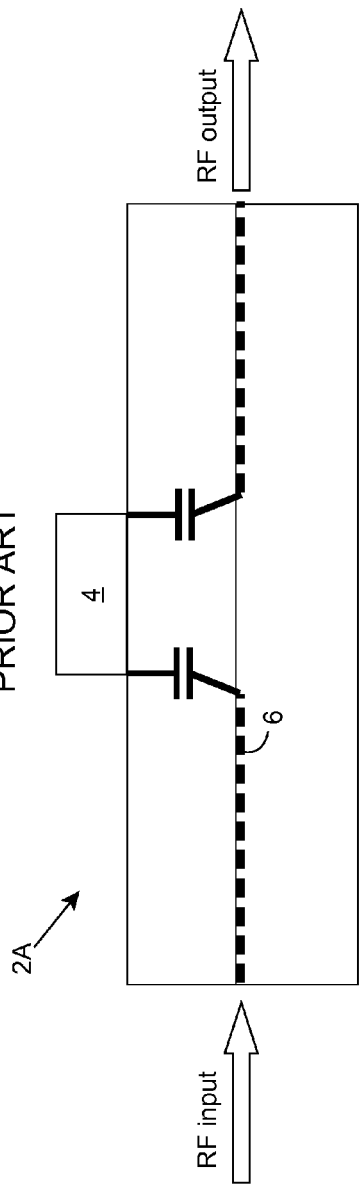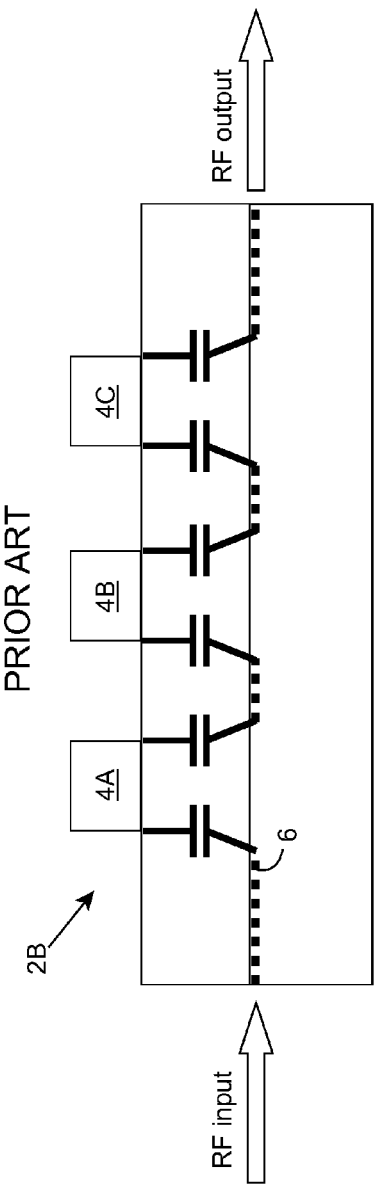

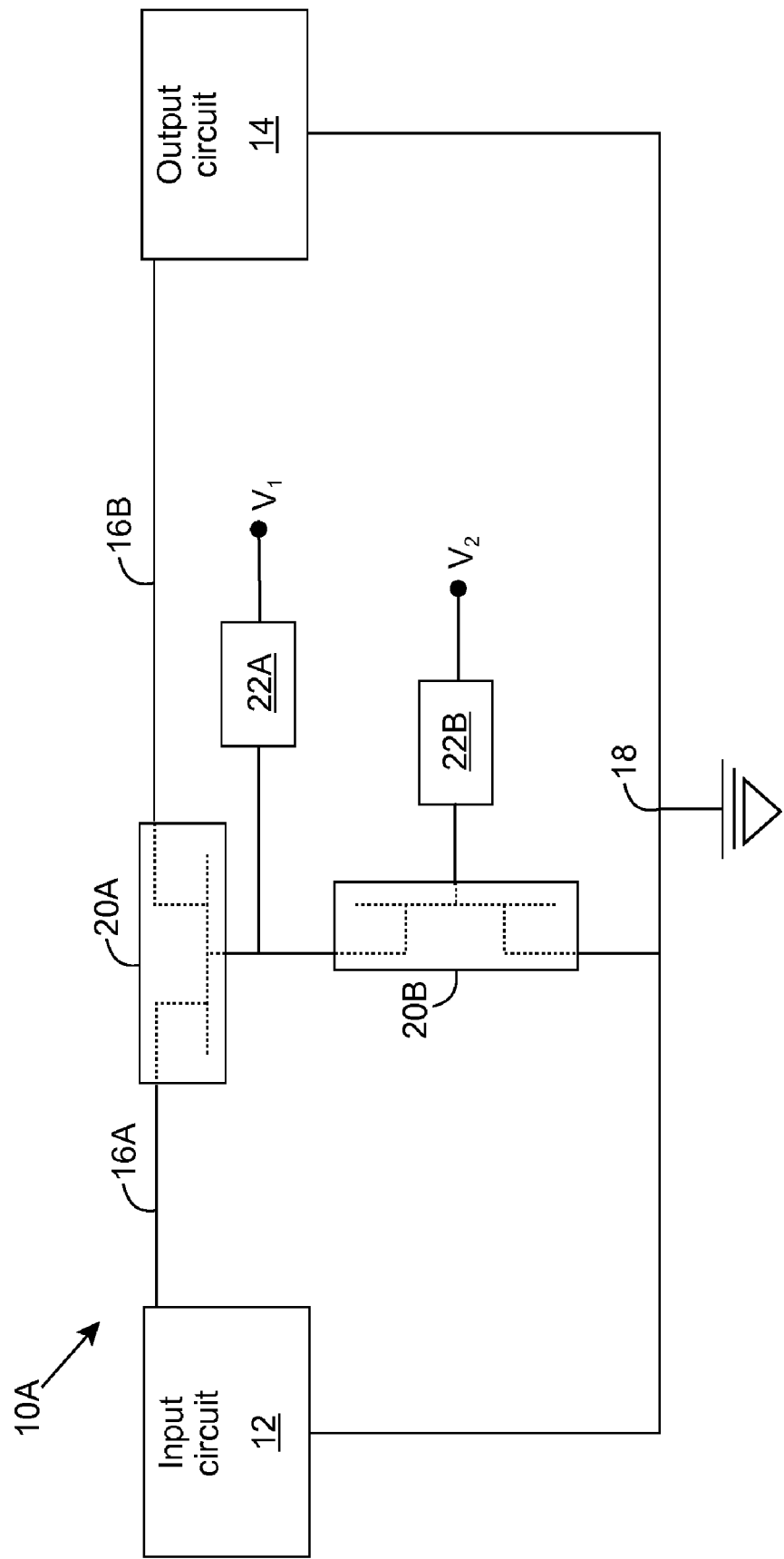

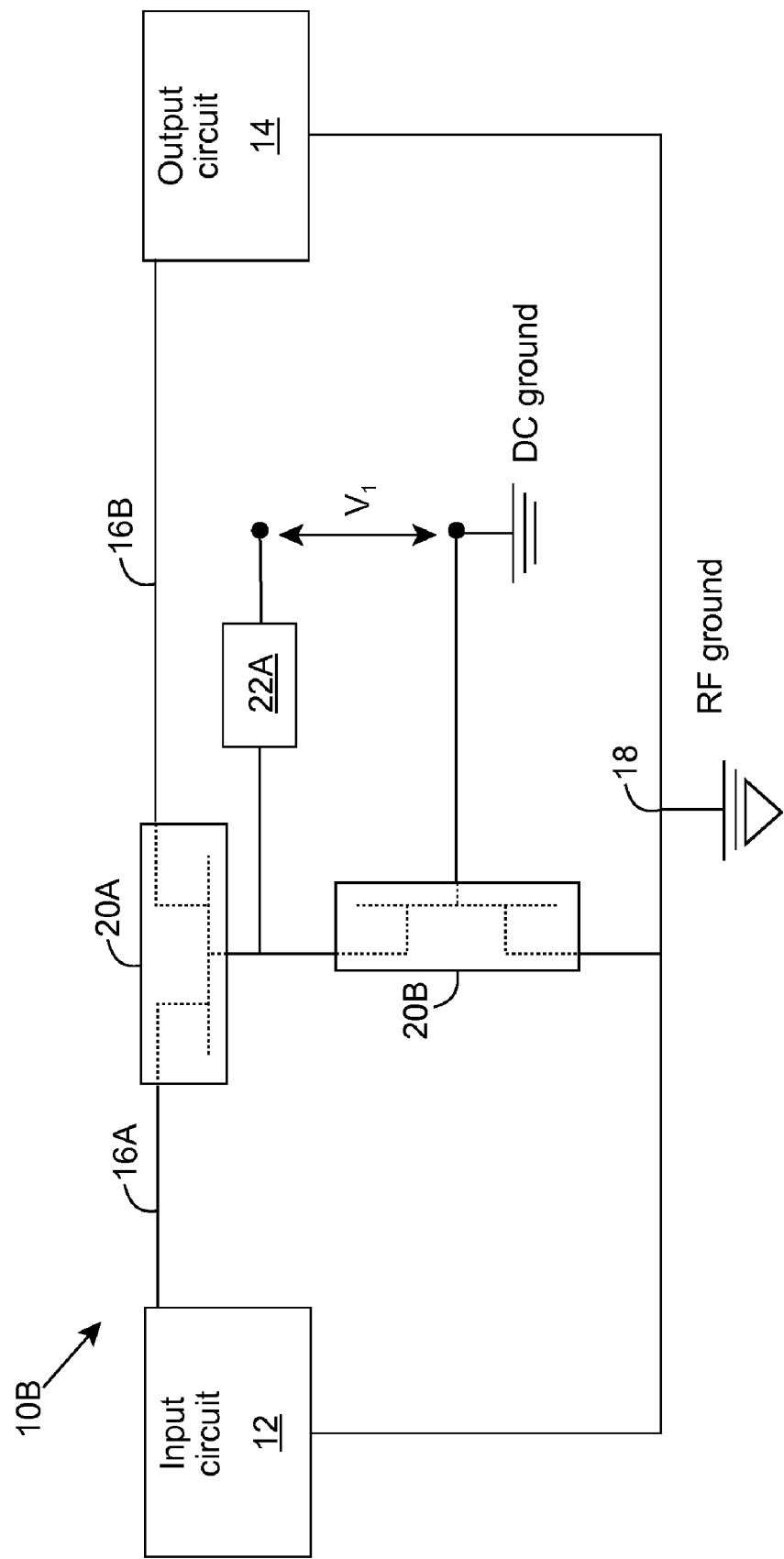

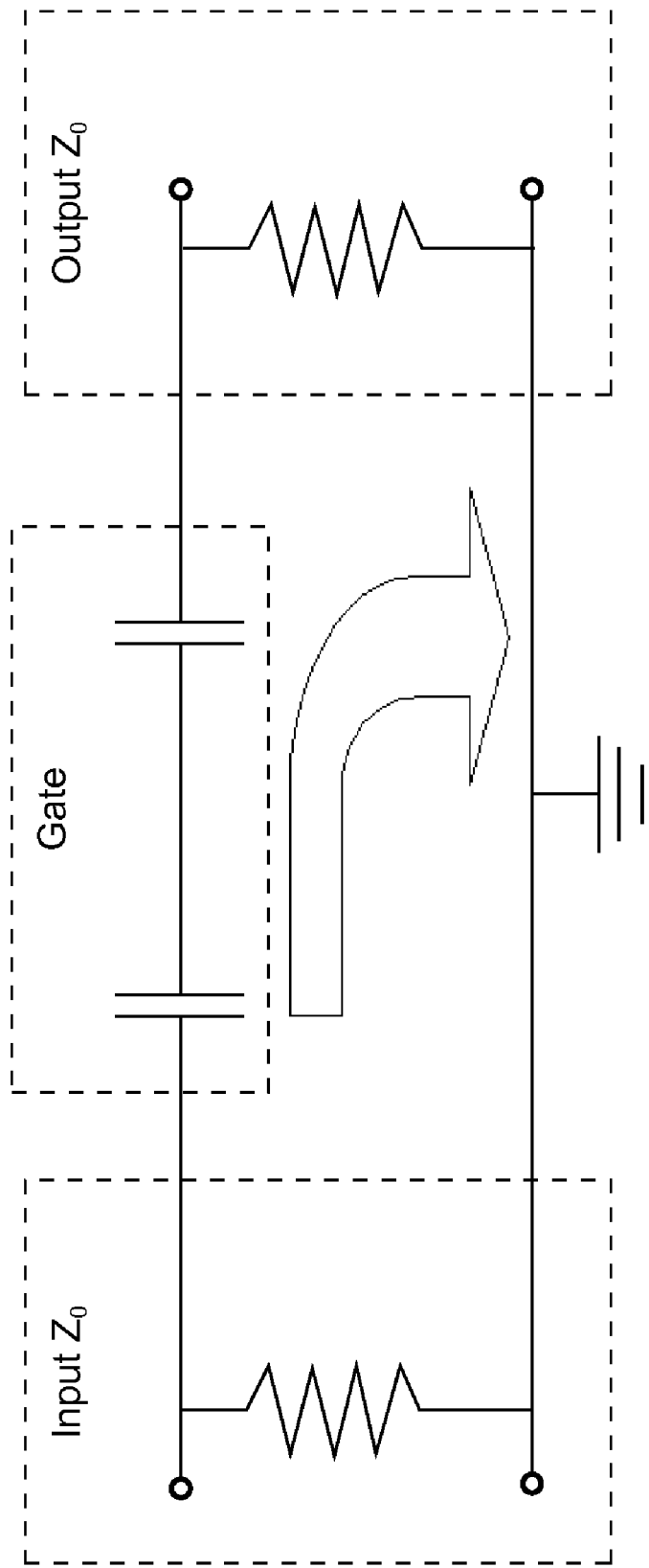

US 8,299,835 B2

RADIO-FREQUENCY SWITCH CIRCUIT WITH SEPARATELY CONTROLLED SHUNT SWITCHING DEVICE

REFERENCE TO PRIOR APPLICATIONS

The current application claims the benefit of co-pending U.S. Provisional Application No. 61/063,250, titled "Radio-frequency switching circuit", which was filed on 1 Feb. 2008, and which is hereby incorporated by reference.

TECHNICAL FIELD

The disclosure relates generally to switches, and more particularly, to an improved radio-frequency switch circuit.

BACKGROUND ART

Solid state radio frequency (RF) switches are important components of Radar transmit/receive (T/R) modules, satellite communication systems, Joint Tactical Radio Systems (JTRS), and the like. A promising RF switch technology uses Heterostructure Field Effect Transistors (HFETs). Recently, high power switches made of AlGaN/GaN HFETs demonstrated superior performance over other RF switching devices in terms of maximum power density, bandwidth, operating temperature, and breakdown voltage.

Many applications, including JTRS and low-noise receivers, require RF switches with a very low insertion loss, e.g., typically below 0.1 dB. A low loss switch dissipates little RF power. As a result, it can be fabricated over a low cost substrate, such as sapphire. Low insertion loss in an HFET is due to a high channel conductance of the device, which is proportional to a total length of the device periphery. Exceptionally high 2D electron gas densities at the AlGaN/GaN interface make a group III-Nitride HFET with a total periphery of two to five mm an ideal candidate for RF switching applications.

The feasibility of high-power broad-band monolithically integrated group III-Nitride HFET RF switches has been demonstrated. Large signal analysis and experimental data for a large periphery group III-Nitride switch indicate that the switch can achieve switching powers exceeding +40 to +50 dBm. However, at frequencies corresponding to the RF frequency band, the OFF state isolation achieved by such a switch is limited by its internal parasitic capacitance, which is also proportional to the total length of the device periphery.

In contrast to Micro Electro-Mechanical Systems (MEMS) technology, high performance RF switching implemented using semiconductor devices, including group III-Nitride HFETs and Metal-Oxide-Semiconductor HFETs (MOSH-FETs), can only be achieved at relatively low operating frequencies, e.g., below approximately 4-5 GHz, and/or in single channel applications. A significant performance limitation is due to the inherent semiconductor device capacitance in the OFF (high impedance) state. A substantial portion of such capacitance is associated with the control terminal of the semiconductor device, e.g., a gate terminal in the FET technology, a base terminal in bipolar junction transistor technology, and/or the like, and therefore, is integral to switching capability.

For example, FIGS. 1A and 1B show illustrative FETs 2A, 2B, respectively, configured to operate as RF switches according to the prior art. As illustrated in FIG. 1A, when FET 2A is in an off state, the RF channel 6 below gate 2A is depleted. However, RF leakage occurs through edge gate 2A to channel 6 capacitance. Similarly, FIG. 1B illustrates the RF leakage for a FET 2B incorporating a more advanced, multi-gate 4A-C design.

A current approach uses Gamma or Pi-type circuits that include a combination of series and shunt-connected semiconductor devices to improve the OFF state isolation of an RF switch. However, such an approach is not suitable for many important RF switch applications. For example, a multi-channel switch is an important component of many modern microwave systems. Assume a series-shunt switch is connected into channel A of the multi-channel switch and channel A is turned off. In this case, due to capacitive coupling through the series device at high operating frequencies, the shunting device will substantially shunt the RF source and any other RF channels, which are supposed to be turned ON when channel A is turned off.

SUMMARY OF THE INVENTION

Aspects of the invention provide a switch circuit that includes at least one main switching device and at least one shunt switching device. Each main switching device is connected in series with a conductor that carries an RF signal between an input circuit and an output circuit. Each shunt switching device is connected between a controlling terminal of the main switching device and a high frequency ground. The switch circuit can provide substantially improved OFF state isolation over other approaches.

A first aspect of the invention provides a circuit comprising: a main switching device including: a main controlling terminal; a first main supplying terminal electrically connected to an input conductor; and a second main supplying terminal electrically connected to an output conductor; and a shunt switching device including: a first shunt supplying terminal electrically connected to the main controlling terminal; and a second shunt supplying terminal electrically connected to a high frequency ground.

A second aspect of the invention provides a circuit comprising: an input circuit including an input conductor; an output circuit including an output conductor; a common high frequency ground for the input circuit and the output circuit; a main field effect transistor including: a main controlling terminal; a first main supplying terminal electrically connected to the input conductor; and a second main supplying terminal electrically connected to the output conductor; and a shunt switching device including: a first shunt supplying terminal electrically connected to the main controlling terminal; and a second shunt supplying terminal electrically connected to the common high frequency ground, wherein the shunt switching device is one of: a field effect transistor, a bipolar junction transistor, or a two-terminal switching device.

A third aspect of the invention provides a circuit comprising: a main switching device including: a main controlling terminal; a first main supplying terminal electrically connected to an input conductor; and a second main supplying terminal electrically connected to an output conductor; and a shunt switching device including: a first shunt supplying terminal electrically connected to the main controlling terminal; and a second shunt supplying terminal electrically connected to a high frequency ground, wherein the main switching device and the shunt switching device are monolithically integrated.

Other aspects of the invention provide circuits, devices, and methods of designing, using and generating each, which include and/or utilize some or all of the circuits described herein. The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIGS. 1A and 1B show illustrative FETs configured to operate as RF switches according to the prior art.

FIGS. 2A and 2B show illustrative RF switch circuits according to embodiments.

FIGS. 3A-3C show illustrative circuit diagrams illustrating a benefit of the RF switch circuit according to an embodiment.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 3B:
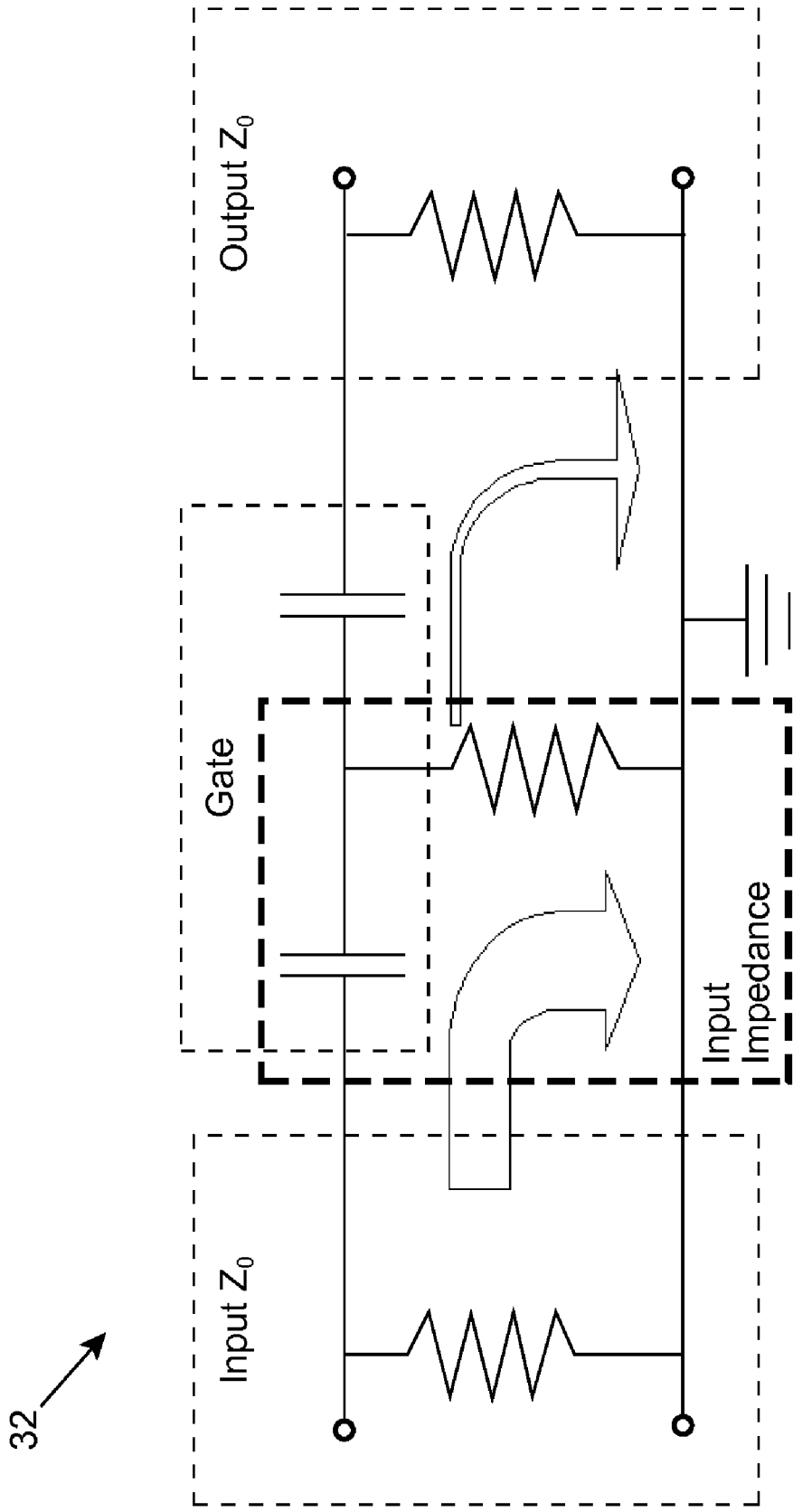

As indicated above, aspects of the invention provide a switch circuit that includes at least one main switching device and at least one shunt switching device. Each main switching device is connected in series with a conductor that carries an RF signal between an input circuit and an output circuit. Each shunt switching device is connected between a controlling terminal of the main switching device and a high frequency ground. The switch circuit can provide substantially improved OFF state isolation over other approaches. As used herein, unless otherwise noted, the term "set" means one or more (i.e., at least one) and the phrase "any solution" means any now known or later developed solution.

Turning to the drawings, FIGS. 2A and 2B show illustrative radio frequency (RF) switch circuits 10A, 10B, respectively, according to embodiments. Circuits 10A, 10B can enable low loss, high isolation, ultra-high frequency RF switching. To this extent, circuits 10A, 10B can provide substantially improved OFF state isolation over other approaches that also use semiconductor devices. It is understood that circuits 10A, 10B can be incorporated into any type of device requiring such a switch, such as a high power, high frequency solid state device. Illustrative devices include radars, detectors, power amplifiers, rectifiers, wireless communication units, all types of power converters, and/or the like.

Circuits 10A, 10B include an input circuit 12 and an output circuit 14. Input circuit 12 is electrically connected to output circuit 14 via a main switching device 20A. To this extent, main switching device 20A comprises a first main supplying terminal electrically connected to an input conductor 16A for input circuit 12, and a second main supplying terminal electrically connected to an output conductor 16B for output circuit 14. Conductors 16A, 16B can comprise any type of conductors, such as a transmission line, a waveguide, a coaxial cable, and/or the like. Input circuit 12 and output circuit 14 also share a common high frequency ground 18.

Operation of main switching device 20A is controlled via an output from a main control circuit 22A, which is electrically connected to a main controlling terminal of main switching device 20A. Additionally, circuits 10A, 10B include a shunt switching device 20B having a first shunt supplying terminal electrically connected to the main controlling terminal of main switching device 20A, and a second shunt supplying terminal electrically connected to the common high frequency ground 18. Shunt switching device 20B operates to decrease an impedance between the controlling terminal of main switching device 20A and the common high frequency ground 18. While shown including a single main switching device 20A and a single shunt switching device 20B, it is understood that circuits 10A, 10B can include two or more main switching devices 20A and/or two or more shunt switching devices 20B.

As used herein, a supplying terminal of a semiconductor device is a contact to a semiconductor device that is used to supply a potential to the active region(s) of the semiconductor device. For example, a supplying terminal can comprise an Ohmic contact. Further, as used herein, a controlling terminal of a semiconductor device is a contact to a semiconductor device such that a voltage difference between the controlling terminal and another terminal of the device or the current flowing from the controlling terminal to another terminal of the device controls an impedance of the active region(s) of the semiconductor device. In an embodiment, one or more supplying and/or controlling terminals of a switching device (e.g., a gate of a FET) comprises a non-ohmic, capacitively coupled contact that provides capacitive impedance between the contact and an active region of the semiconductor device, and can be easier to fabricate over alternative types of terminals. Further, in some applications, such as a high frequency application, a heterostructure device including a high aluminum content AlGaN layer, a non-ohmic, capacitively coupled contact can provide improved contact impedance over alternative types of terminals. In any event, the terminals of a semiconductor device can serve as supplying or controlling terminals depending on the biasing conditions and external circuit to which the semiconductor device is connected.

In typical circuit implementations, the supplying terminals of a FET are the source and drain, the supplying terminals of a bipolar junction transistor (BJT) in a common emitter configuration are the collector and emitter, the supplying terminals of a semiconductor diode are the cathode and anode, and/or the like. Similarly, in typical circuit implementations, the controlling terminal of a FET is the gate, the controlling terminal for the BJT in the common emitter configuration is the base, and the controlling terminal(s) for the semiconductor diode are both the cathode and anode. To this extent, a terminal of a semiconductor device can be configured to simultaneously serve as both a supplying and controlling terminal.

As also used herein, a switching device 20A, 20B is a semiconductor device that changes its impedance in a wide dynamic range in response to electrical signal(s) applied to one or more of the controlling terminal(s) of the semiconductor device. In an embodiment, switching devices 20A and 20B each comprise a field effect transistor (FET). To this extent, it is understood that switching device 20A and/or switching device 20B can comprise any type of FET now known or later developed. For example, switching device 20A and/or 20B can comprise a heterostructure FET (HFET), an inverted heterostructure FET, a junction FET, an insulated gate FET, a metal semiconductor FET, a doped channel metal-semiconductor FET, a metal oxide semiconductor FET, a metal insulator semiconductor FET, a doped channel metal-insulator-semiconductor FET, high electron mobility transistor, double heterostructure FET, etc. To this extent, a controlling terminal of a FET can comprise an insulated gate and comprise one or more layers of any type of insulating material, such as a dielectric. The insulating material can include one or more of any type of uniform or composite dielectric layers. For example, the insulating material can include oxygen containing dielectric materials (e.g., $SiO_2$, $HfO_2$, or the like), nitrogen containing dielectric materials, such as a SiN compound (e.g., SiN, $Si_3N_4$), and/or the like. Use of an insulated gate can reduce leaks, thereby reducing DC power consumption, improve DC control, improve maximum switching power, lower frequency distortion, improve long term stability and reliability, and/or the like for the corresponding FET.

However, it is understood that switching device 20A and/or switching device 20B can comprise any type of switching device including two or more supplying terminals and one or more controlling terminals, such as any type of BJT now known or later developed (e.g., a heterojunction bipolar transistor, an insulated gate bipolar junction transistor, etc.), and/or the like. Further, it is understood that switching device 20B can comprise a two-terminal switching device, such as any type of semiconductor diode now known or later developed, and/or the like. In a typical embodiment, main switching device 20A can comprise a transistor having two or more supplying terminals (non-controlling electrodes) and at least one controlling terminal, while shunt switching device 20B can comprise a transistor or a two-terminal semiconductor device controlled by a potential difference between its terminals.

Further, it is understood that switching devices 20A, 20B can be manufactured using any type of elementary or compound semiconductor material system, such as one or more layers of materials selected from the group-III nitride material system (e.g., $Al_X In_Y Ga_{1-X-Y}N$, where $0 \leq X, Y \leq 1$, and $X+Y \leq 1$ and/or alloys thereof), one or more layers of materials selected from the group-III arsenide material system (e.g., $Al_X Ga_{1-X}As$, where $0 \leq X \leq 1$, and/or alloys thereof), one or more layers of materials selected from the InGaP material system (e.g., $In_X Ga_{1-X}P$, where $0 \leq X \leq 1$, and/or alloys thereof), Silicon, Germanium, ZnO, SiC, diamond, any combination of two or more of these materials, and/or the like.

In circuit 10A of FIG. 2A, operation of switching devices 20A, 20B are controlled by control signals generated using separate control circuits 22A, 22B, respectively, and electrically connected to a corresponding controlling terminal of each switching device 20A, 20B. Alternatively, as illustrated in circuit 10B of FIG. 2B, a single control signal can be used to control both switching devices 20A, 20B by biasing simultaneously the controlling terminal of device 20A (or a control circuit 22A therefor) and a supplying terminal of device 20B electrically connected to the controlling terminal of device 20A with respect to DC ground. In another alternative, switching device 20B can comprise a two-terminal switching device for which a separate control signal is not generated and applied. To this extent, the first shunt terminal, which can comprise, for example, a non-ohmic, capacitively coupled contact, acts as a controlling terminal for shunt switching device 20B. In this manner, the design of switching device 20B and the application of control voltages to switching device 20B can be simplified.

In an embodiment, control circuit(s) 22A, 22B operate main switching device 20A and shunt switching device 20B in a manner such that switching devices 20A, 20B are substantially simultaneously switched into opposite operating states. For example, shunting switching device 20B is turned "ON" when main switching device 20A is turned "OFF", and shunting switching device 20B is turned "OFF" when main switching device 20A is turned "ON".

Figure 3C:
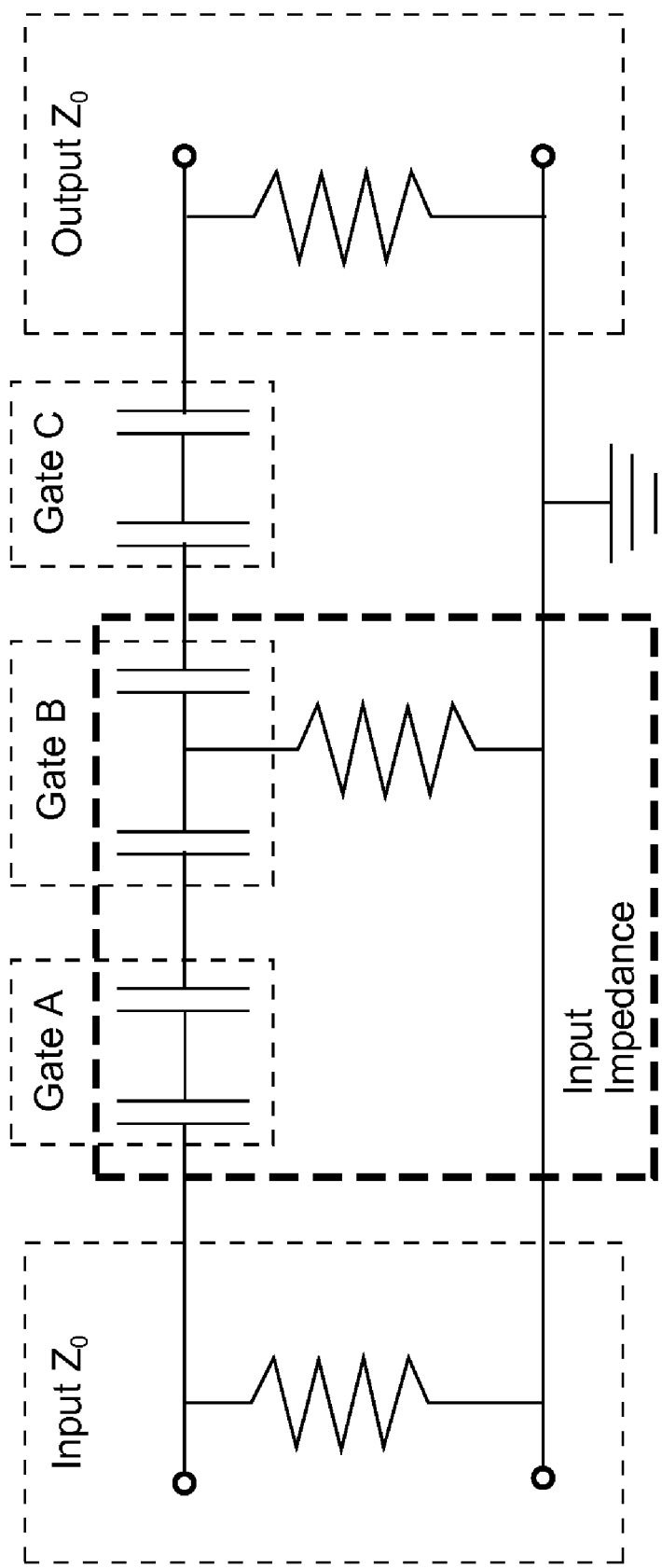

FIGS. 3A-3C show illustrative circuit diagrams illustrating a benefit of the RF switch circuit 10A (FIG. 2A) or 10B (FIG. 2B) according to an embodiment. In FIG. 3A, a circuit diagram 30 shows operation of a switch circuit implemented without any shunt switching device(s). As illustrated, when the switch is in the OFF state, the input RF signal is transferred to the output through frequency-dependent impedance of the gate edges (e.g., as shown in FIG. 1A). In FIG. 3B, a circuit diagram 32 shows an effect of shunt switching device 20B (FIGS. 2A and 2B) being switched to an ON state while main switching device 20A (FIGS. 2A and 2B) is in an OFF state. In this case, a bridge formed by a low-impedance state of shunt switching device 20B and a high-impedance state of main switching device 20A splits the transferred RF signal into two non-equal parts. The largest part of the transferred RF signal is shorted to ground via shunt switching device 20B, thereby improving the isolation of the RF switch.

In an embodiment, main switching device 20A comprises a multi-gate design. To this extent, in FIG. 3C, a circuit diagram 34 shows the effect of incorporating shunt switching device 20B in a circuit that includes a main switching device 20A having a multi-gate design (e.g., multiple gate stripes). In this case, an impedance of the RF leak path is increased proportional to the number of gates for main switching device 20A. Similarly, an impedance of the "output" shoulder of the shunting bridge is increased, while its ground-shunting impedance remains the same. Overall input impedance of the circuit in the OFF state is also increased providing an improved solution to multi-channel applications.

Figure 4:
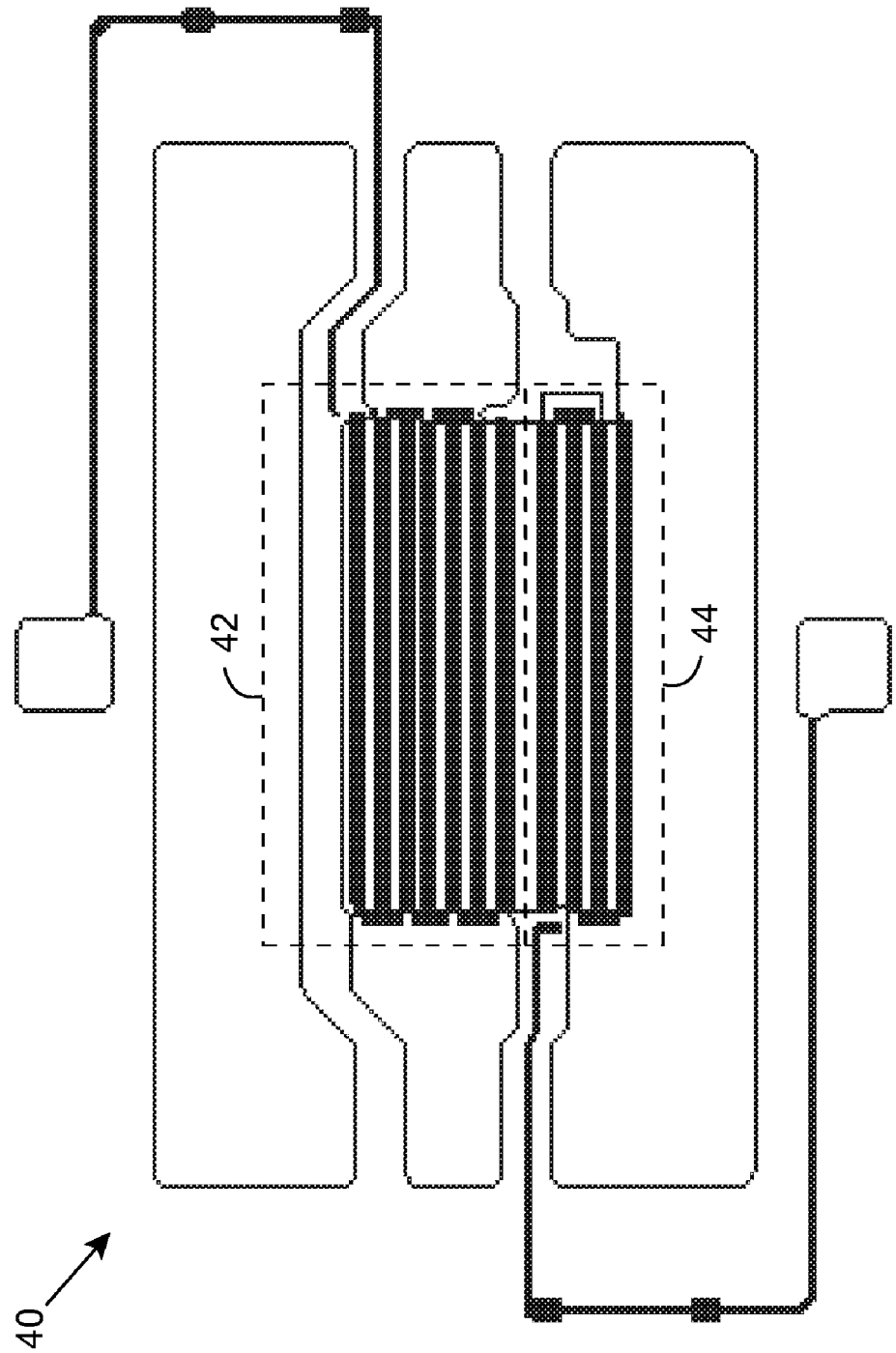
FIG. 4 shows an illustrative integrated circuit layout of a monolithically integrated RF switch according to an embodiment.

Returning briefly to FIGS. 2A and 2B, an embodiment of circuits 10A, 10B can be implemented using monolithically integrated switching devices 20A, 20B and/or all of circuits 10A, 10B can be monolithically integrated. To this extent, FIG. 4 shows an illustrative integrated circuit layout of a monolithically integrated RF switch 40 according to an embodiment. Switch 40 includes a single main switching device 42 and a single shunt switching device 44. As illustrated, each switching device 42, 44 comprises a large-periphery, multi-finger FET. In an embodiment, each switching device comprises a group-III nitride-based HFET (e.g., AlGaN/GaN).

Figure 5B:
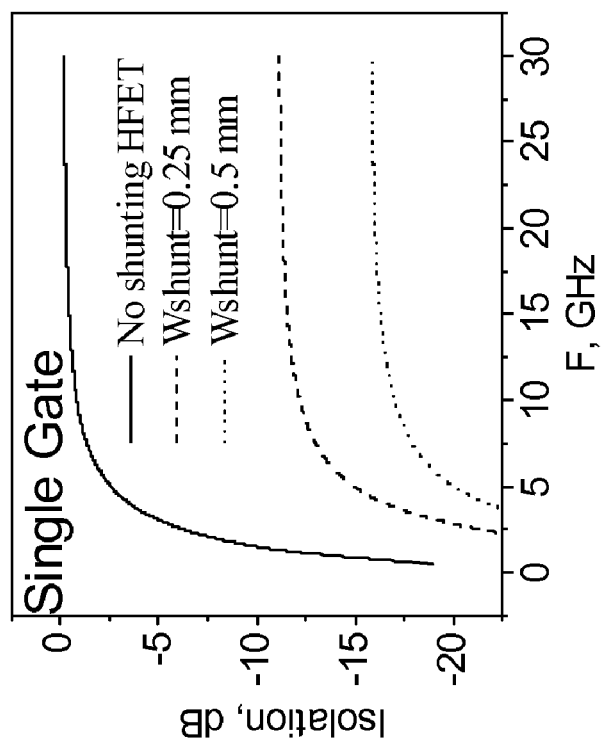
FIGS. 5A-5D show circuit insertion loss and isolation as a function of frequency for illustrative circuits according to an embodiment.
Figure 5A:
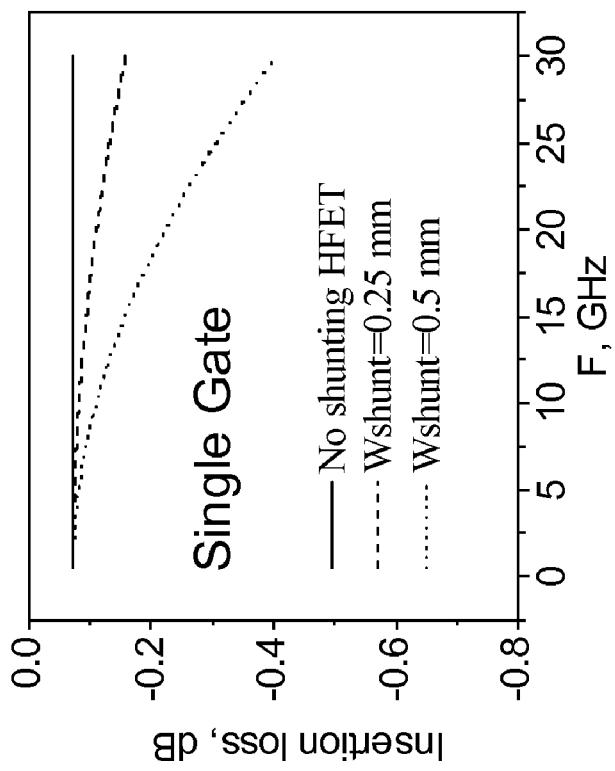
Figure 5D:
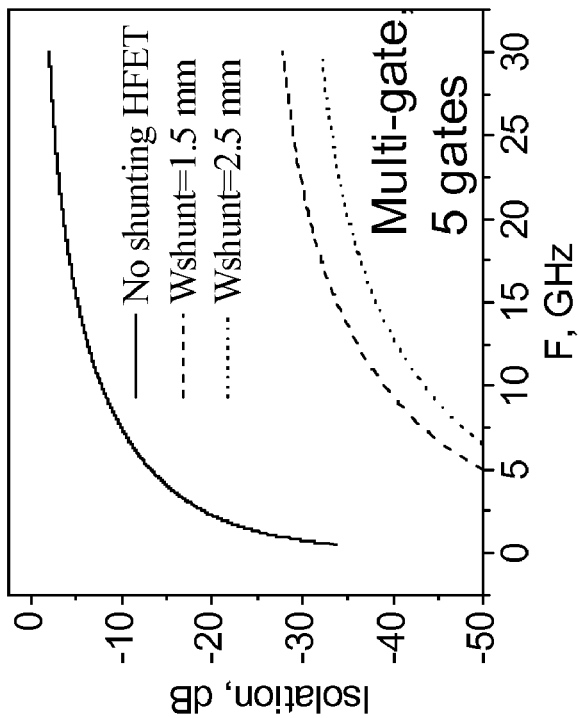
Figure 5C:
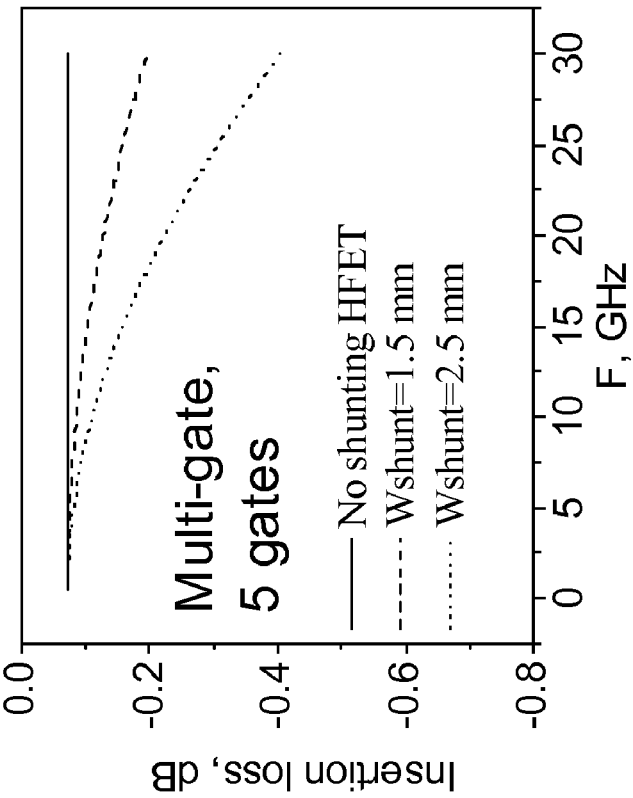

FIGS. 5A-5D show circuit insertion loss and isolation as a function of frequency for illustrative circuits according to an embodiment. These and similar dependencies can be simulated using appropriate models for the semiconductor switching devices (main and shunt) used to fabricate the switch circuit. FIGS. 5A and 5B show simulated frequency dependencies of the circuit insertion loss and isolation, respectively, for a switch circuit that includes an AlGaN/GaN HFET with a single gate for the main switching device. In different embodiments of the circuit of FIGS. 5A and 5B, no shunt switching device was included, or an AlGaN/GaN HFET with a single gate was used as the shunt switching device with varying widths. Similarly, FIGS. 5C and 5D show simulated frequency dependencies of the circuit insertion loss and isolation, respectively, for similar switch circuits including AlGaN/GaN HFET(s) for the switching device(s). However, in this case, the series switching device and the shunt switching device (if present) included a multiple gate structure. In particular, gate structure for each device included five gate stripes.

While primarily shown and described as circuits. It is understood that aspects of the invention further provide methods of manufacturing the circuits and devices incorporating a circuit described herein. For example, a switch circuit, such as circuit 10A, can be incorporated into a device including an RF input circuit and RF output circuit to provide a switching function between the RF circuits using any solution. In particular, supplying terminals of the main switching device 20A can be electrically connected in series to a conductor carrying an RF signal between the RF circuits, while a supplying terminal of the shunt switching device 20B can be electrically connected to a common RF ground for the RF circuits. Further, the controlling terminal(s) of the switching devices can be electrically connected to the corresponding control circuit(s) of the device.

Further, aspects of the invention provide methods of operating a device incorporating a circuit described herein. In this case, the method includes selectively enabling a radio frequency signal to pass from an RF input circuit to an RF output circuit by applying an output of a control circuit to a controlling terminal of a main switching device. Additionally, such a method can include controlling a shunt switching device in a manner such that the shunt switching device and the main switching device are substantially simultaneously switched into opposite operating states.

Still further, aspects of the invention provide a method of designing a switch circuit described herein. In particular, a total required impedance of the main and shunt switching devices can be determined. For example, the total required impedance can be selected to meet a required isolation at a given operating frequency of an application for the switch circuit (e.g., type of device and operating characteristics of the device) using, for example, the data shown in FIGS. 5A-5D.

The total impedance can be translated into a total device periphery based on a material system for the switch circuit using any solution, and a switch circuit, such as a monolithically integrated switch circuit, can be designed to include the total device periphery. For example, a total device periphery of an HFET implemented as the main switching device (SRS) can be found based on its corresponding insertion loss requirements. The insertion loss of the HFET can be calculated by the formula:

$$IL_{SRS}(dB)=20 \text{ Log}(1+R_{SRS}/2R_L) \approx 4.35 R_{SRS}/R_L,$$

where $R_{SRS}$ is the resistance of the HFET in a highly conductive state (e.g., at zero gate bias). Using this formula, in order to obtain a $R_L=50\Omega$ and an $IL_{SRS} \leq 0.1$ dB, $R_{SRS}<1.15\Omega$ is required. A corresponding HFET width can be derived from the HFET ON-resistance, which can be calculated using the formula:

$$R_{SRS}=R_{ON1}/W_{SRS}=2R_{C1}/W_{SRS}+R_{SH} \times L_{SD}/W_{SRS},$$

where $R_{ON1}$ is the unit-width resistance. For an illustrative $R_{ON1}=2.5\Omega \times$mm, a $W_{SRS}>2.2$ mm will be needed to meet the insertion loss requirements.

Similarly, a total device periphery of a shunt switching device (SHT) can be determined based on switch isolation. In the OFF-state, the switch isolation can be determined mainly by an impedance of the shunt switching device. In a limiting case of vary high frequencies where the impedance of the series switching device becomes small due to a pinched-off capacitance, the minimal switch isolation can be estimated using the formula $$IS(dB) \approx 20 \text{ Log }[1+R_L/(2R_{SHT})]=20 \text{ Log }[1+R_L W_{SHT}/(2R_{SHT1})],$$

where $R_{SHT}$ and $R_{SHT1}$ are the resistance and resistance per unit width of the shunt switching device in a highly conducting state. Using the unit-width device parameters provided above with respect to the main switching device, a required shunt device width, WSHT, to obtain a minimum of 25 dB isolation is approximately 1.5 mm.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A circuit comprising:
    a main switching device including:
        a main controlling terminal;
        a first main supplying terminal electrically connected to an input conductor of a signal line; and
        a second main supplying terminal electrically connected to an output conductor of the signal line;
    a first control circuit having a first voltage output electrically connected to the main controlling terminal;
    a shunt switching device for the main controlling terminal, wherein the shunt switching device is electrically isolated from the signal line, the shunt switching device including:
        a first shunt supplying terminal electrically connected to the main controlling terminal; and
        a second shunt supplying terminal electrically connected to a high frequency ground; and
    a second control circuit, distinct from the first control circuit, having a second voltage output electrically connected to a shunt controlling terminal of the shunt switching device, wherein the shunt switching device is configured to provide a low impedance path from the main controlling terminal to the high frequency ground when the main switching device is in an off state.

2. The circuit of claim 1, further comprising:
    an input circuit including the input conductor; and
    an output circuit including the output conductor, wherein the high frequency ground is a common high frequency ground for the input circuit and the output circuit.

3. The circuit of claim 1, wherein the first and second control circuits are configured to operate the main switching device and the shunt switching device such that the shunt switching device is in an opposite operating state as the main switching device.

4. The circuit of claim 1, wherein at least one of the main switching device or the shunt switching device is a field effect transistor.

5. The circuit of claim 1, wherein at least one of the main switching device or the shunt switching device is a bipolar junction transistor.

6. The circuit of claim 1, wherein the supplying terminals for at least one of the main switching device or the shunt switching device comprise non-ohmic, capacitively coupled contacts.

7. The circuit of claim 1, wherein the shunt switching device is a two-terminal switching device.

8. The circuit of claim 1, wherein at least one of: the main switching device or the shunt switching device comprises a semiconductor material selected from the group consisting of: Silicon, Germanium, AlGaAs, AlInGaN, InP, ZnO, SiC, and diamond.

9. The circuit of claim 1, wherein the controlling terminal for at least one of the main switching device or the shunt switching device comprises a non-ohmic, capacitively coupled contact.

10. A circuit comprising:
an input circuit including an input conductor;
an output circuit including an output conductor;
a common high frequency ground for the input circuit and the output circuit;
a main field effect transistor including:
   a main controlling terminal;
   a first main supplying terminal electrically connected to the input conductor; and
   a second main supplying terminal electrically connected to the output conductor;
a first control circuit having a first voltage output electrically connected to the main controlling terminal;
a shunt switching device for the main controlling terminal, wherein the shunt switching device is electrically isolated from the input conductor and the output conductor, the shunt switching device including:
   a first shunt supplying terminal electrically connected to the main controlling terminal; and
   a second shunt supplying terminal electrically connected to the common high frequency ground, wherein the shunt switching device is one of: a field effect transistor or a bipolar junction transistor; and
a second control circuit, distinct from the first control circuit, having a second voltage output electrically connected to a shunt controlling terminal of the shunt switching device, wherein the shunt switching device is configured to provide a low impedance path from the main controlling terminal to the common high frequency ground when the main switching device is in an off state.

11. The circuit of claim 10, wherein at least one of: the main field effect transistor or the shunt switching device is a heterostructure field effect transistor.

12. The circuit of claim 11, wherein the heterostructure field effect transistor comprises at least one layer of group-III nitride material.

13. The circuit of claim 10, wherein the main controlling terminal comprises a gate comprising a plurality of gate stripes.

14. The circuit of claim 10, wherein at least one of: the main controlling terminal or the shunt controlling terminal for the shunt switching device comprises an insulated gate.

15. The circuit of claim 10, wherein at least one of: the main field effect transistor or the shunt switching device is an inverted heterostructure field effect transistor.

16. The circuit of claim 10, wherein at least one of: the main field effect transistor or the shunt switching device is a doped channel metal-semiconductor field effect transistor.

17. The circuit of claim 10, wherein at least one of: the main field effect transistor or the shunt switching device is a doped channel metal-insulator-semiconductor field effect transistor.

18. A circuit comprising:
a main switching device including:
   a main controlling terminal;
   a first main supplying terminal electrically connected to an input conductor of a signal line; and
   a second main supplying terminal electrically connected to an output conductor of the signal line;
a first control circuit having a first voltage output electrically connected to the main controlling terminal;
a shunt switching device for the main controlling terminal, wherein the shunt switching device is electrically isolated from the signal line, the shunt switching device including:
   a first shunt supplying terminal electrically connected to the main controlling terminal; and
   a second shunt supplying terminal electrically connected to a high frequency ground, wherein the main switching device and the shunt switching device are monolithically integrated; and
a second control circuit, distinct from the first control circuit, having a second voltage output electrically connected to a shunt controlling terminal of the shunt switching device, wherein the shunt switching device is configured to provide a low impedance path from the main controlling terminal to the high frequency ground when the main switching device is in an off state.

19. The circuit of claim 18, further comprising:
an input circuit including the input conductor; and
an output circuit including the output conductor, wherein the high frequency ground is a common high frequency ground for the input circuit and the output circuit, and wherein the input circuit and the output circuit are monolithically integrated with the main switching device and the shunt switching device.

20. The circuit of claim 18, wherein at least one of the main switching device or the shunt switching device is a heterostructure field effect transistor comprising at least one layer of group-III nitride material.

* * * * *